(12) United States Patent
Pang et al.

(10) Patent No.: US 8,791,776 B2
(45) Date of Patent: Jul. 29, 2014

(54) ACOUSTIC WAVE RESONATOR HAVING A GASKET

(76) Inventors: Wei Pang, Beijing (CN); Hao Zhang, Zhuhai (CN)

(*) Notice: Subject to any disclaimer, the term of this patent is extended or adjusted under 35 U.S.C. 154(b) by 467 days.

(21) Appl. No.: 13/009,724

(22) Filed: Jan. 19, 2011

(65) Prior Publication Data

US 2012/0182090 A1    Jul. 19, 2012

(51) Int. Cl.
| | |
|---|---|
| *H03H 9/15* | (2006.01) |
| *H03H 9/54* | (2006.01) |
| *H03H 9/17* | (2006.01) |
| *H03H 9/02* | (2006.01) |

(52) U.S. Cl.
CPC .............. *H03H 9/175* (2013.01); *H03H 9/173* (2013.01); *H03H 9/02086* (2013.01)
USPC ........... 333/187; 333/189; 310/312; 310/324; 310/335

(58) Field of Classification Search
CPC ............ H03H 9/02118; H03H 9/0211; H03H 9/02086; H03H 9/173; H03H 9/174; H03H 9/175; H03H 9/177
USPC .......... 333/187–189; 310/312, 322, 324, 334, 310/335
See application file for complete search history.

(56) References Cited

U.S. PATENT DOCUMENTS

| | | | | |
|---|---|---|---|---|
| 6,424,237 | B1* | 7/2002 | Ruby et al. ..................... | 333/187 |
| 6,788,170 | B1* | 9/2004 | Kaitila et al. ................ | 333/187 |
| 6,812,619 | B1* | 11/2004 | Kaitila et al. ................ | 310/320 |
| 7,280,007 | B2 | 10/2007 | Feng et al. | |
| 7,388,454 | B2* | 6/2008 | Ruby et al. ..................... | 333/187 |
| 7,598,826 | B2* | 10/2009 | Yamaguchi et al. .......... | 333/187 |
| 7,649,304 | B2* | 1/2010 | Umeda et al. ................. | 310/320 |
| 7,893,793 | B2* | 2/2011 | Iwasaki et al. ................ | 333/133 |
| 8,456,257 | B1* | 6/2013 | Fattinger ...................... | 333/187 |
| 2002/0014808 | A1* | 2/2002 | Misu et al. .................... | 310/312 |
| 2002/0030424 | A1* | 3/2002 | Iwata ............................ | 310/363 |

(Continued)

FOREIGN PATENT DOCUMENTS

| | | | |
|---|---|---|---|
| WO | WO 2009/013938 | * | 1/2009 |
| WO | WO 2010/095640 | * | 8/2010 |

OTHER PUBLICATIONS

T. Pensala et al.; "Spurious Resonance Suppression in Gigahertz-Range ZnO Thin-Film Bulk Acoustic Wave Resonators by the Boundary Frame Method: Modeling and Experiment"; IEEE Transactions on Ultrasonics, Ferroelectrics, and Frequency Control, vol. 56, No. 8, Aug. 2009, pp. 1731-1744.*

(Continued)

*Primary Examiner* — Barbara Summons
(74) *Attorney, Agent, or Firm* — Morris, Manning & Martin, LLP; Tim Tingkang Xia, Esq.

(57) ABSTRACT

In one aspect of the invention, an acoustic wave device includes a substrate, an acoustic isolator formed in or on the substrate, a bottom electrode formed on the acoustic isolator, a piezoelectric layer formed on the bottom electrode, a top electrode formed on the piezoelectric layer, and boundary means such as a gasket surrounding one of the first and second electrodes whose perimeter is aligned inside the perimeter of the acoustic isolator. The gasket has a lateral side having a wall profile, a curve profile, a multi-step profile, a gradually variable profile, or a combination of them.

10 Claims, 16 Drawing Sheets

(56) References Cited

U.S. PATENT DOCUMENTS

| | | | |
|---|---|---|---|
| 2002/0158716 A1* | 10/2002 | Pensala | 333/195 |
| 2007/0210877 A1* | 9/2007 | Osugi et al. | 333/187 |
| 2008/0042780 A1* | 2/2008 | Lee et al. | 333/187 |
| 2008/0179995 A1* | 7/2008 | Umeda et al. | 310/324 |
| 2009/0001848 A1* | 1/2009 | Umeda et al. | 310/312 |
| 2009/0153268 A1* | 6/2009 | Milsom et al. | 333/187 |
| 2010/0134210 A1* | 6/2010 | Umeda | 333/189 |
| 2010/0141353 A1* | 6/2010 | Iwaki et al. | 333/133 |
| 2011/0298564 A1* | 12/2011 | Iwashita et al. | 333/187 |

OTHER PUBLICATIONS

R. Ohara et al.; "Suppression of Acoustic Energy Leakage in FBARs with Al Bottom Electrode: FEM Simulation and Experimental Results"; 2007 IEEE Ultrasonics Symposium, Oct. 28-31, 2007, pp. 1657-1660.*

* cited by examiner

ACOUSTIC WAVE RESONATOR HAVING A GASKET

CROSS-REFERENCE TO RELATED PATENT APPLICATION

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention relates generally to an acoustic wave device, and more particularly, to a thin film piezoelectric resonator that utilizes a boundary means such as a gasket surrounding one of the top and bottom electrodes to enhance the electrical performance thereof.

BACKGROUND OF THE INVENTION

Mobile communications products, such as cellular phone and handsets, are required to be small and light. Such products require radio frequency (RF) filters approximately covering the range 0.5 GHz to 10 GHz to protect the received signal from interference, from the transmitter in the same handset and/or from unwanted externally generated signals. These filters must have low pass-band insertion loss (typically, less than 2 dB) in order to achieve adequate signal-to-noise ratio. Due to their high quality factor, superior power handling capability, low cost packaging on silicon and potential for integration above IC, thin film bulk acoustic wave (BAW) resonators and filters have been widely used in mobile radio communication devices. As shown in FIG. 7, the simplest implementation of a BAW resonator 10 comprises a thin layer 14 of a piezoelectric material, for example, aluminum nitride (AlN), zinc oxide, and PZT, arranged between a bottom metal electrode 13 and a top metal electrode 15. Typically, the BAW resonator 10 is acoustically isolated from a supporting substrate 11 by an acoustic isolator 12, which may include an air cavity formed under a membrane supporting the BAW resonator 10 or an acoustic mirror that includes of a stack of layers alternately formed of high and low acoustic impedance materials. For such a BAW resonator, several wave modes can propagate horizontally along the layers. The modes are formed by such combinations of longitudinal and shear bulk waves traveling at different angles in the layers that can fulfill continuity conditions across layer interfaces and boundary conditions at the extreme ends of the stack. The propagating plate modes are generally called the Lamb waves. A BAW resonator with finite lateral dimensions usually exhibits a multitude of spurious resonances between $f_s$ and $f_p$, as shown in FIG. 8.

Performance of such a thin film BAW resonator can be represented by the effective electromechanical coupling coefficient ($K_{t,eff}^2$) and the quality (Q) factor. The greater the electromechanical coupling coefficient $K_{t,eff}^2$ becomes, the wider the bandwidth of an RF filter or the tuning range of a voltage controlled resonator can be made.

U.S. Pat. No. 7,280,007 to Feng et al. discloses a technique to increase the quality factor $Q_p$ through adding a mass load layer to the resonator perimeter. Although the quality factor $Q_p$ is improved by this method, the added mass load layer causes an increase of the shunt capacitance ($C_o$) and reductions of both of $K_{t,eff}^2$ and Q near series resonant frequency ($Q_s$), which are observed with increasing frame width. This is not ideal in some applications where both $Q_s$ and $K_{t,eff}^2$ should be maximized, for example, UMTS band 1 duplexer. Additionally, the spurious resonances below $f_s$ are enhanced by the raised frame. The spurious resonances cause a risk of generating strong ripples in the pass band of a filter.

Therefore, it is desirable to have a resonator structure with an enhanced $Q_p$ without compromising $K_{t,eff}^2$, spurious modes and $Q_s$. Hence, a heretofore unaddressed need exists in the art to address the aforementioned deficiencies and inadequacies.

SUMMARY OF THE INVENTION

In one aspect of the present invention, an acoustic wave resonator includes a substrate, and an acoustic isolator formed in or on the substrate, having a perimeter defining a first edge and an opposite, second edge. The acoustic isolator comprises an air cavity or an acoustic mirror.

The acoustic wave resonator also includes a first electrode formed on the acoustic isolator, a piezoelectric layer formed on the first electrode, and a second electrode formed on the piezoelectric layer, having a perimeter defining a first edge and an opposite, second edge. The perimeter of the second electrode is aligned inside the perimeter of the acoustic isolator. In one embodiment, the first edges of the acoustic isolator and the second electrode define a first distance, D1, therebetween, and the second edges of the acoustic isolator and the second electrode define a second distance, D2, therebetween.

The acoustic wave resonator further includes a gasket formed on the piezoelectric layer such that the gasket surrounds the perimeter of the second electrode and is aligned inside the perimeter of the acoustic isolator. The gasket and the perimeter of the second electrode define a third distance, D3, therebetween. The gasket is configured to establish a boundary condition surrounding the perimeter of the second electrode so as to provide energy trapping of Lamb modes within the acoustic wave resonator.

In one embodiment, the gasket has a lateral side facing the second electrode, where the lateral side has a wall profile, a curve profile, a multi-step profile, a gradually variable profile, or a combination of them.

The gasket has a width, W, and a height, H, and wherein the width W is preferred to be less than the first and second distances D1 and D2, and the height H is less or larger than a thickness of the second electrode.

In one embodiment, the gasket is formed of a dielectric material including silicon oxide, silicon carbide, silicon nitride, or aluminum nitride, and $0 \leq D3 \leq 20$ μm. In another embodiment, the gasket is formed of a metal material same as or substantially different from that of the first and second electrodes, and $0 < D3 \leq 20$ μm. A gap defined by the third distance D3 between the gasket and the perimeter of the second electrode in one embodiment is filled with a non-conductive material.

In another aspect of the present invention, an acoustic wave resonator includes a substrate; an acoustic isolator formed in or on the substrate, having a perimeter defining a first edge and an opposite, second edge; a first electrode formed on the acoustic isolator, having a perimeter defining a first edge and an opposite, second edge; a piezoelectric layer formed on the first electrode; a second electrode formed on the piezoelectric layer, having a perimeter defining a first edge and an opposite, second edge, wherein one of the perimeters of the first and second electrodes is aligned inside the perimeter of the acoustic isolator, and the other of the perimeters of the first and second electrodes is aligned outside the perimeter of the acoustic isolator; and a gasket formed such that the gasket surrounds the one of the first and second electrodes whose perimeter is aligned inside the perimeter of the acoustic isolator. The gasket is configured to establish a boundary condition surrounding the perimeter of the one of the first and second electrodes so as to provide energy trapping of Lamb modes within the acoustic wave resonator.

In one embodiment, the acoustic isolator comprises an air cavity or an acoustic mirror.

In one embodiment, the first edges of the acoustic isolator and the one of the first and second electrodes whose perimeter is aligned inside the perimeter of the acoustic isolator define a first distance, D1, therebetween, and the second edges of the acoustic isolator and the one of the first and second electrodes define a second distance, D2, therebetween.

In one embodiment, the gasket is aligned inside the perimeter of the acoustic isolator. The gasket has a lateral side facing the one of the first and second electrodes, wherein the lateral side has a wall profile, a curve profile, a multi-step profile, a gradually variable profile, or a combination of them. The gasket has a width, W, and a height, H, and wherein the width W is less than the first and second distances D1 and D2.

The gasket and the perimeter of the one of the first and second electrodes define a third distance, D3, therebetween. In one embodiment, the gasket is formed of a dielectric material including silicon oxide, silicon carbide, silicon nitride, or aluminum nitride, and $0 \leq D3 \leq 20$ µm. In another embodiment, the gasket is formed of a metal material same as or substantially different from that of the first and second electrodes, and $0 < D3 \leq 20$ µm. A gap defined by the third distance D3 between the gasket and the perimeter of the second electrode in one embodiment is filled with a non-conductive material.

In yet another aspect of the present invention, an acoustic wave resonator includes a substrate; an acoustic isolator formed in or on the substrate, having a perimeter defining a first edge and an opposite, second edge; a first electrode formed on the acoustic isolator, having a perimeter defining a first edge and an opposite, second edge; a piezoelectric layer formed on the first electrode; a second electrode formed on the piezoelectric layer, having a perimeter defining a first edge and an opposite, second edge, wherein one of the perimeters of the first and second electrodes is aligned inside the perimeter of the acoustic isolator, and the other of the perimeters of the first and second electrodes is aligned outside the perimeter of the acoustic isolator; and boundary means surrounding the perimeter of the one of the first and second electrodes so as to provide energy trapping of Lamb modes within the acoustic wave resonator.

In one embodiment, the first edges of the acoustic isolator and the one of the first and second electrodes whose perimeter is aligned inside the perimeter of the acoustic isolator define a first distance, D1, therebetween, and the second edges of the acoustic isolator and the one of the first and second electrodes define a second distance, D2, therebetween.

In one embodiment, the boundary means is aligned inside the perimeter of the acoustic isolator. The boundary means and the perimeter of the one of the first and second electrodes define a third distance, D3, therebetween.

In one embodiment, the boundary means comprises a gasket formed of a dielectric material or a metal material. The gasket has a lateral side facing the one of the first and second electrodes, wherein the lateral side has a wall profile, a curve profile, a multi-step profile, a gradually variable profile, or a combination of them.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1A:
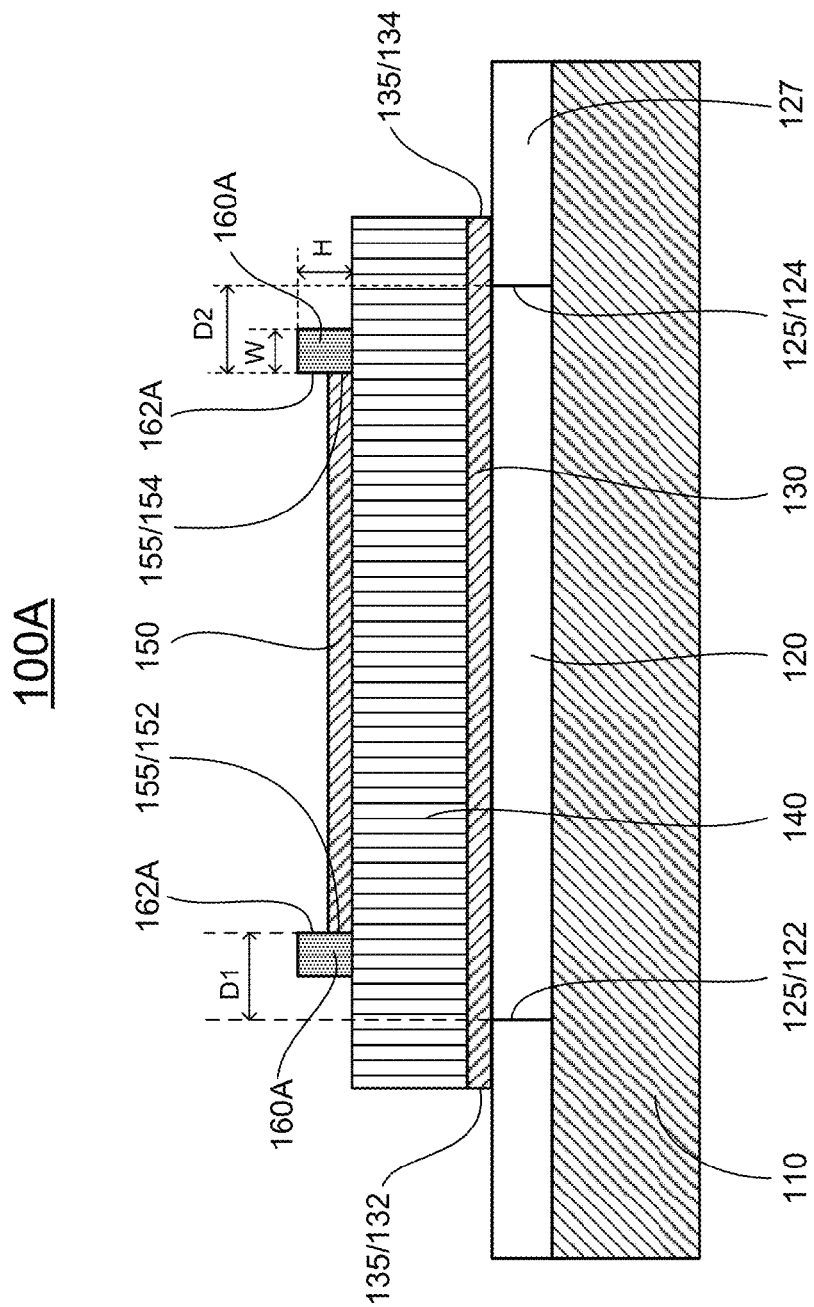
FIG. 1A shows schematically a cross sectional view of an acoustic wave resonator according to one embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, "plurality" means two or more.

As used herein, the terms "comprising," "including," "carrying," "having," "containing," "involving," and the like are to be understood to be open-ended, i.e., to mean including but not limited to.

The term "layer", as used herein, refers to a thin sheet or thin film.

The term "electrode", as used herein, is an electrically conductive layer or film comprising a single-layer structure or a multi-layer structure formed of one or more electrically conductive materials.

The term "piezoelectric layer" as used herein, is a layer comprising one or more different layers, of which at least one exhibits piezoelectric activity. The other layers may be non-piezoelectric dielectric or used to perform special performance effects like temperature coefficient compensation or to facilitate manufacturing like adhesion layers. In addition, the other layers are typically thin when compared to the at least one layer exhibiting piezoelectric activity.

The description will be made as to the embodiments of the present invention in conjunction with the accompanying drawings. In accordance with the purposes of this invention, as embodied and broadly described herein, this invention, in one aspect, relates to an acoustic wave resonator/device that utilizes a boundary means such as a gasket surrounding one of the top and bottom electrodes to enhance the electrical performance thereof.

The acoustic wave resonator includes a substrate, an acoustic isolator formed in or on the substrate, a first (bottom) electrode formed on the acoustic isolator, a piezoelectric layer formed on the first electrode, a second (top) electrode formed on the piezoelectric layer, and boundary means surrounding one of the first and second electrodes whose perimeter is aligned inside the perimeter of the acoustic isolator. In one embodiment, the boundary means comprises a gasket formed of a dielectric material or a conductive material. The gasket has a lateral side having a wall profile, a curve profile, a multi-step profile, a gradually variable profile, or a combination of them.

Referring to FIG. 1A, an acoustic wave resonator 100A is shown according to one embodiment of the present invention. The acoustic wave resonator 100A includes a substrate 110, an acoustic isolator 120 formed in or on the substrate 110, a first (bottom) electrode 130 formed on the acoustic isolator 120, a piezoelectric (PZ) layer 140 formed on the first electrode 130, and a second (top) electrode 150 formed on the piezoelectric layer 140.

The acoustic isolator 120 has a perimeter 125 defining a first edge 122 and an opposite, second edge 124. The acoustic isolator 120 can be an air cavity or an acoustic mirror. Alternatively, the acoustic isolator 120 can be defined by a dielectric layer 127 formed on the substrate 110.

The bottom electrode 130 has a perimeter 135 defining a first edge 132 and an opposite, second edge 134 that are aligned outside the perimeter 125 of the acoustic isolator 120 in the horizontal direction.

The top electrode 150 has a perimeter 155 defining a first edge 152 and an opposite, second edge 154. The perimeter 155 of the top electrode 150 is generally in a pentagon shape having five relatively straight edges (not shown), but can be in any polygonal shapes, circular shapes, or any other smooth or irregular geometric shapes. The perimeter 155 of the top electrode 150 is aligned inside the perimeter 125 of the acoustic isolator 120 in the horizontal direction. Further, the first edge 122 of the acoustic isolator 120 and the first edge 152 of the top electrode 150 define a first lateral distance, D1, therebetween. The second edge 124 of the acoustic isolator 120 and the second edge 154 of the top electrode 150 define a second lateral distance, D2, therebetween. The first lateral distance D1 and the second lateral distance D2 can be identical to or substantially different from each other. The first lateral distance D1 and the second lateral distance D2 are typically in a range of about 0.1 µm to 20 µm.

As shown in FIG. 1A, the acoustic wave resonator 100A also includes a gasket 160A configured to establish a continuous boundary condition surrounding the perimeter 155 of the top electrode 150 so as to provide energy trapping of Lamb modes within the acoustic wave resonator 100A. The gasket 160A is formed on the PZ layer 140 and surrounds the perimeter 155 of the top electrode 150. Further, the gasket 160A is aligned inside the perimeter 125 of the acoustic isolator 120 in the horizontal direction. In this example, the gasket 160A is in contact with the perimeter 155 of the top electrode 150. As shown in FIG. 2 below, the gasket may be separated from the perimeter of the top electrode by a gap (a third distance), D3. The gap D3 is in a range from about 0 to 20 µm, and is preferred to be as small as possible.

The gasket 160A has dimensions characterized with a width, W, and a height, H. The gasket width W is preferred to be less than the first and second lateral distances D1 and D2, so that the gasket 160A is inside the first and second edges 122 and 124 of the acoustic isolator 120 in the horizontal direction. In this exemplary embodiment shown in FIG. 1A, the gasket height H is larger than a thickness of the top electrode 150. In other embodiments, the gasket height H may be equal to or less than a thickness of the top electrode 150. The dimensions of the gasket 160A are selected to improve the electrical properties as measured on the acoustic wave resonator 100A (or on filters made with the resonator). This may be determined by experimentation, Finite Element Modeling analysis, or other analytical solutions to determine the width W and the height H of the gasket 160A.

Figure 1B:
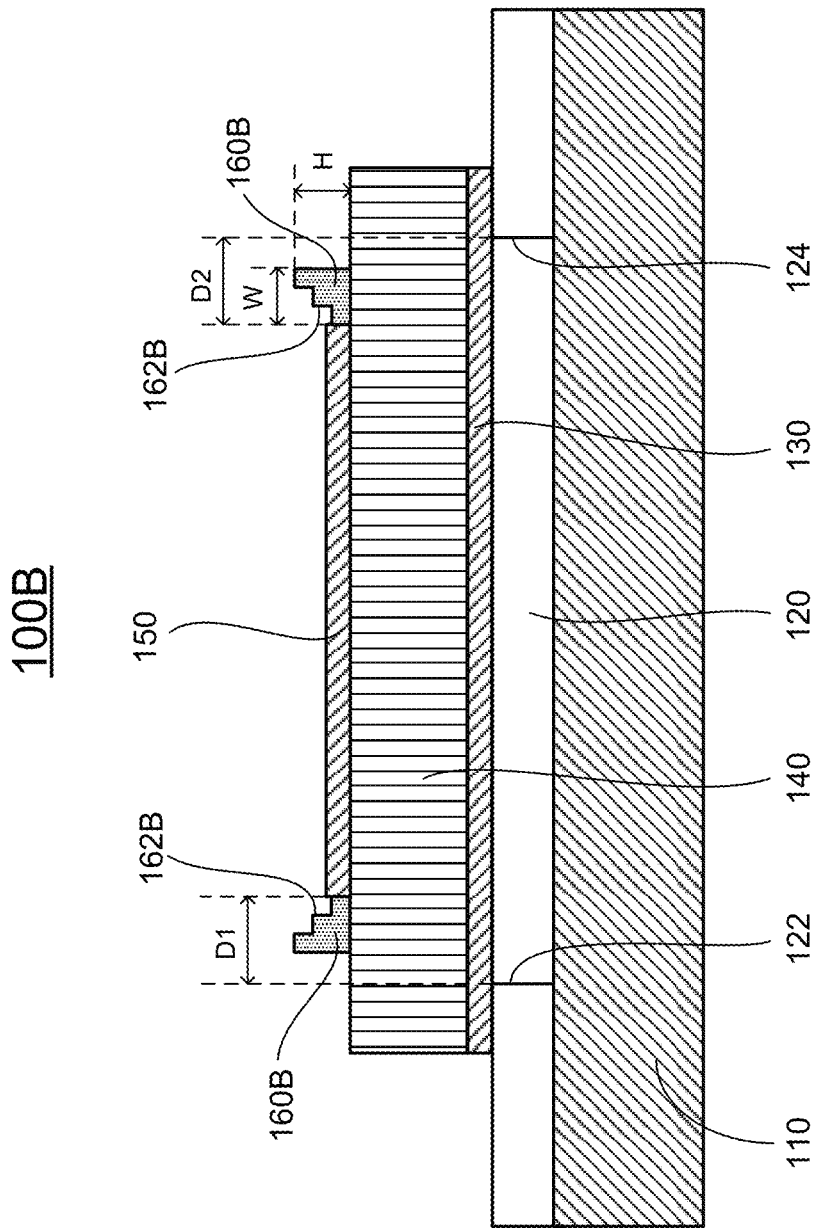
FIG. 1B shows schematically a cross sectional view of an acoustic wave resonator according to another embodiment of the present invention.
Figure 1C:
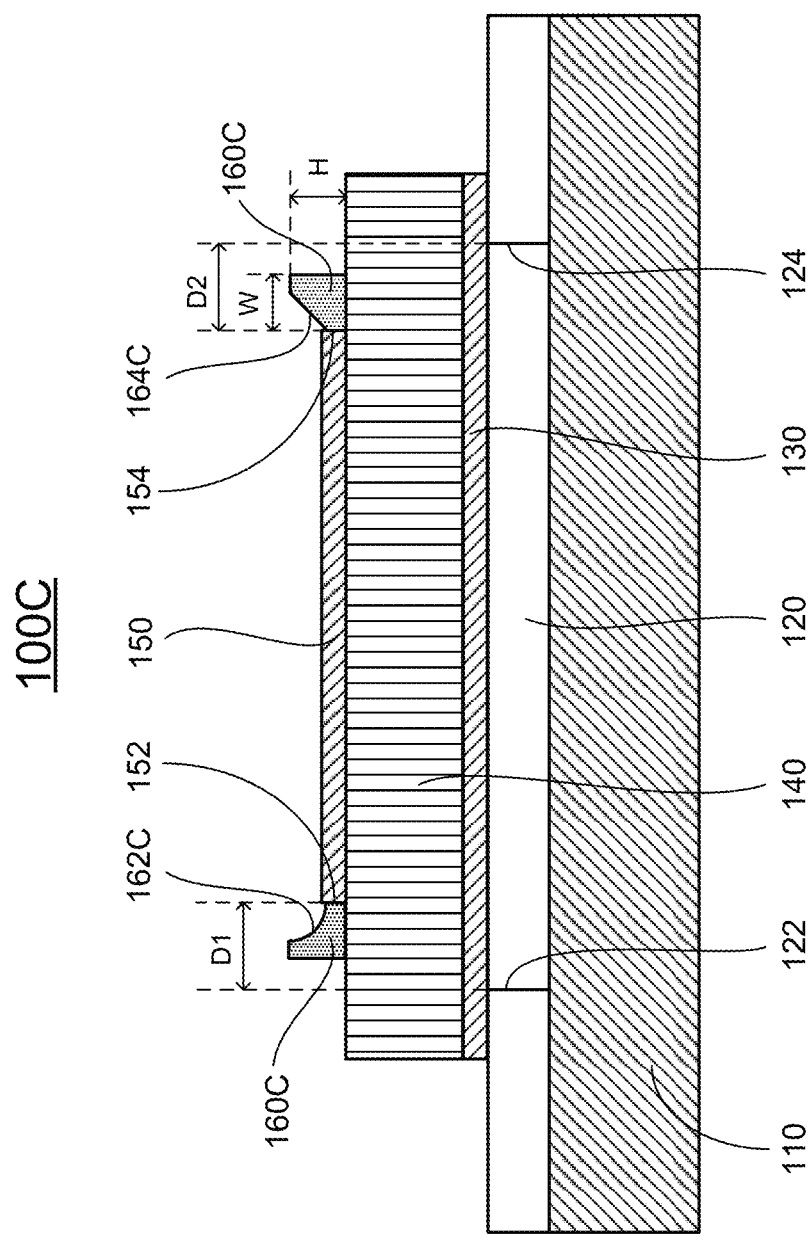
FIG. 1C shows schematically a cross sectional view of an acoustic wave resonator according to yet another embodiment of the present invention.

The gasket 160A has a lateral side facing the perimeter 155 of the top electrode 150. As shown in FIG. 1A, the lateral side has a vertical wall profile 162A. As shown in FIGS. 1B and 1C, the lateral side may have a multi-step profile, a curve profile, a gradually variable profile, or a combination of them. According to the present invention, the gasket 160A is adapted for establishing a boundary condition for energy trapping of Lamb modes within the acoustic wave resonator 100A.

In one embodiment, the substrate 110 is formed of silicon (Si) and the PZ layer 140 is formed of a piezoelectric material, such as, aluminum nitride (AlN), zinc oxide, or PZT. Alternatively, other piezoelectric materials may be used for the PZ layer 140. The bottom and top electrodes 130 and 150 are formed of an electrical conductive material such as tungsten (W) or molybdenum (Mo). The gasket 160A may be formed of a dielectric material including silicon oxide, silicon carbide, silicon nitride, or aluminum nitride, or formed of a metal material same as or substantially different from that of the bottom and top electrodes 130 and 150, e.g., W or Mo. For a metal gasket, the distance of the gap D3 can not be zero.

FIG. 1B shows another embodiment of an acoustic wave resonator 100B of the present invention. The acoustic wave resonator 100B has a multilayered structure essentially same as that of the acoustic wave resonator 100A of FIG. 1A, except that the gasket 160B having the lateral side with a multi-step profile 162B, which faces the perimeter 155 of the top electrode 150.

FIG. 1C shows a further embodiment of an acoustic wave resonator 100C of the present invention. Similarly, the acoustic wave resonator 100C has a multilayered structure essentially same as that of the acoustic wave resonator 100A of FIG. 1A, except that the gasket 160C having the lateral side with a gradually variable profile, i.e., a profile gradually varying from one profile to another profile. For example, the lateral side proximate to the first edge 152 of the top electrode 150 has a curve profile 162C, while the lateral side proximate to the second edge 154 of the top electrode 150 has a declined profile 164C. In the other location, the later side of the gasket 160C has a profile that may be a combination of the curve profile 162C and the declined profile 164C.

In these embodiments of the acoustic wave resonators 100A-100C shown in FIGS. 1A-1C, the gasket 160A/160B/106C is in contact with the perimeter 155 of the top electrode 150. In other words, there is no gap between the gasket 160A/160B/106C and the perimeter 155 of the top electrode 150.

Figure 2A:
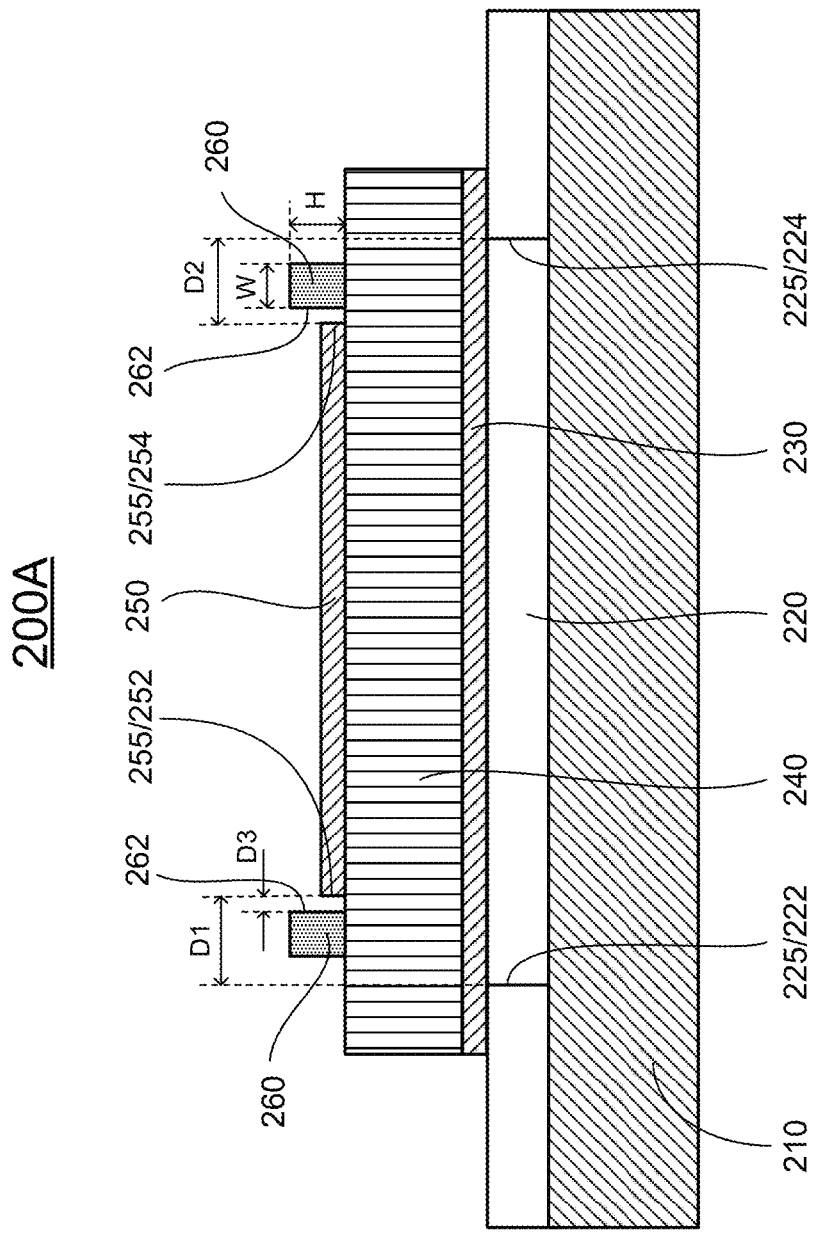
FIG. 2A shows schematically a cross sectional view of an acoustic wave resonator according to a further embodiment of the present invention.

FIG. 2A shows an alternative embodiment of an acoustic wave resonator 200 of the present invention. Similarly, the acoustic wave resonator 200 has a multilayered structure supported by an acoustic isolator 220 that is formed in or on a substrate 210. The acoustic isolator 220 has a perimeter 225 defining a first edge 222 and an opposite, second edge 224. The multilayered structure includes a bottom electrode 230 formed on the acoustic isolator 220, a PZ layer 240 formed on the bottom electrode 230, and a top electrode 250 formed on the PZ layer 240, and a gasket 260 formed on the PZ layer 240 and surrounding the top electrode 250. The top electrode 250 has a perimeter 255 defining a first edge 252 and an opposite, second edge 254. The perimeter 255 of the top electrode 250 is aligned inside the perimeter 225 of the acoustic isolator 220 in the horizontal direction. Further, the first edge 222 of the acoustic isolator 220 and the first edge 252 of the top electrode 250 define a first lateral distance, D1, therebetween. The second edge 224 of the acoustic isolator 220 and the second edge 254 of the top electrode 250 define a second lateral distance, D2, therebetween.

Figure 2B:
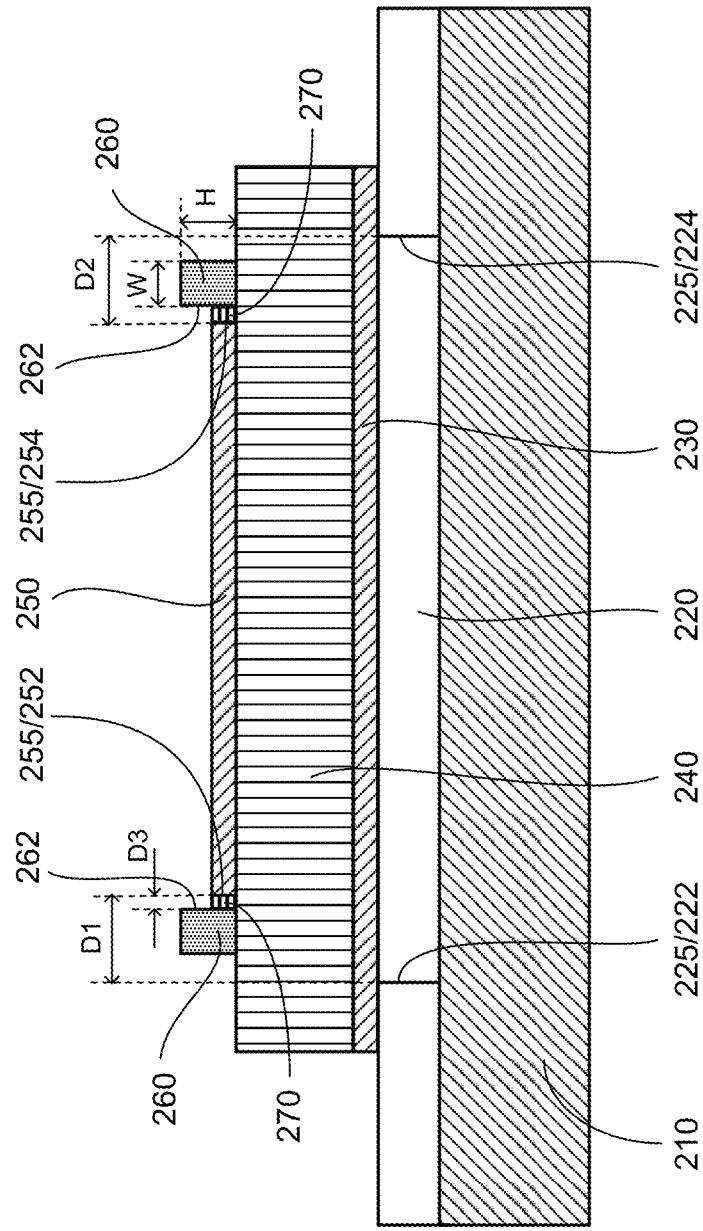
FIG. 2B shows schematically a cross sectional view of an acoustic wave resonator according to yet a further embodiment of the present invention.

However, the gasket 260 is separated from the perimeter 255 of the top electrode 250 by a gap (a third distance), D3, which is defined between the lateral side 262 of the gasket and the perimeter 255 of the top electrode 250. Particularly, for a conductive gasket 260, it must be separated from the top electrode 250 by the gap D3, so as to prevent from electrically connection with the top electrode 250. The gap D3 is preferably defined as small as possible. In one embodiment, as shown in FIG. 2B, the gap D3 is filled with a non-conductive material 270, such as dielectrics and polymer, to isolate the top electrode 250 from the conductive gasket 260.

Figure 3:
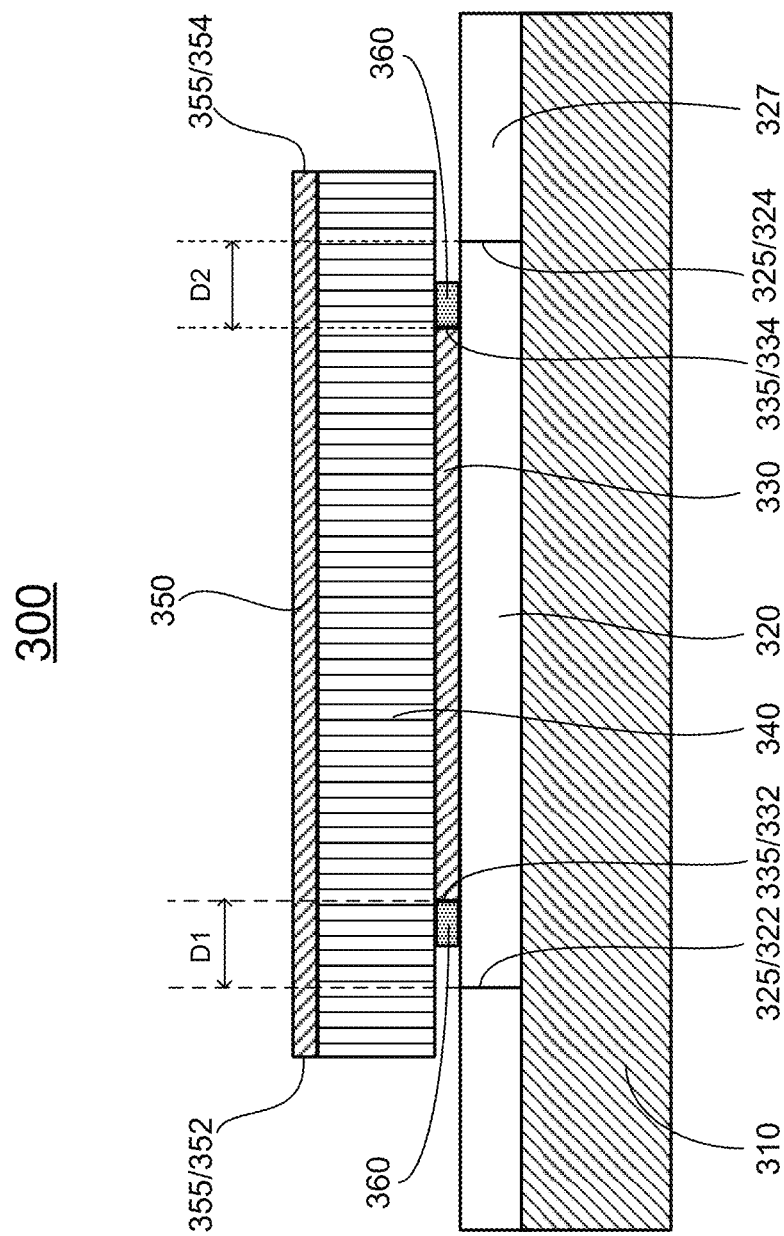
FIG. 3 shows schematically a cross sectional view of an acoustic wave resonator according to yet a further embodiment of the present invention.

Referring to FIG. 3, an acoustic wave resonator 300 is shown according to one embodiment of the present invention. The acoustic wave resonator 300 includes a substrate 310, an acoustic isolator 320 formed in or on the substrate 310, a bottom electrode 330 formed on the acoustic isolator 320, a PZ layer 340 formed on the bottom electrode 330, a top electrode 350 formed on the piezoelectric layer 340, and a gasket 360 formed on the acoustic isolator 320 and surrounding the bottom electrode 330.

Similarly, the acoustic isolator 320 has a perimeter 325 defining a first edge 322 and an opposite, second edge 324. The acoustic isolator 320 can be an air cavity or an acoustic mirror. Alternatively, the acoustic isolator 320 can be defined by a dielectric layer 327 formed on the substrate 310.

Each of the bottom and top electrodes 330/350 has a perimeter 335/355 defining a first edge 332/352 and an opposite, second edge 334/354. The perimeter 355 of the top electrode 350 is aligned outside the perimeter 325 of the acoustic isolator 320, while the perimeter 335 of the bottom electrode 330 is aligned inside the perimeter 325 of the acoustic isolator 320 in the horizontal direction. Further, the first edge 322 of the acoustic isolator 320 and the first edge 332 of the bottom electrode 330 define a first lateral distance, D1, therebetween. The second edge 324 of the acoustic isolator 320 and the second edge 334 of the bottom electrode 330 define a second lateral distance, D2, therebetween. The first lateral distance D1 and the second lateral distance D2 can be identical to or substantially different from each other. The first lateral distance D1 and the second lateral distance D2 are typically in a range of about 0.1 μm to 20 μm.

In the exemplary embodiment, the gasket 360 is in contact with the perimeter 335 of the bottom electrode 330 and aligned inside the perimeter 325 of the acoustic isolator 320 in the horizontal direction. The gasket 360 may be separated from 335 the perimeter of the bottom electrode 330 by a third distance (a gap), D3, where the gap D3 is in a range from about 0 to 20 μm, and is preferred to be as small as possible.

The gasket 360 has dimensions characterized with a width and a height. The dimensions of the gasket 360 are adapted for improving the electrical properties as measured on the acoustic wave resonator 300, which may be determined by experimentation, Finite Element Modeling analysis, or other analytical solutions to determine the width and the height of the gasket.

Figure 8:
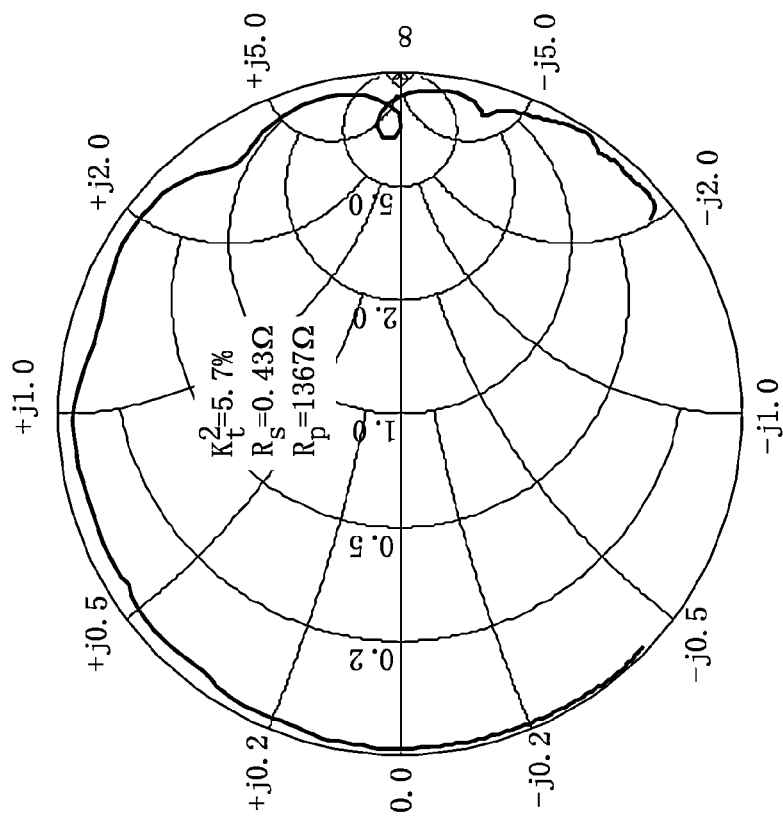
FIG. 8 shows the Smith chart representation of the responses ($S_{11}$) of the conventional acoustic wave resonator of FIG. 7.

The quality factor $Q_p$ of a BAW resonator depends proportionally on a parameter of resistance called $R_p$ near parallel resonant frequency. Typically, the resistance $R_p$ is in a range of about 1000 Ohms to 2000 Ohms on conventional resonators and there is strong spurious resonance excited above $f_s$, as shown in FIG. 8. The resistance $R_p$ may be improved by the gasket having an optimal size, thereby enhancing the performance of the BAW resonator, as shown in FIGS. 4A-4D, 5A-5E and 6A-6F.

Figures 4A, 4B:
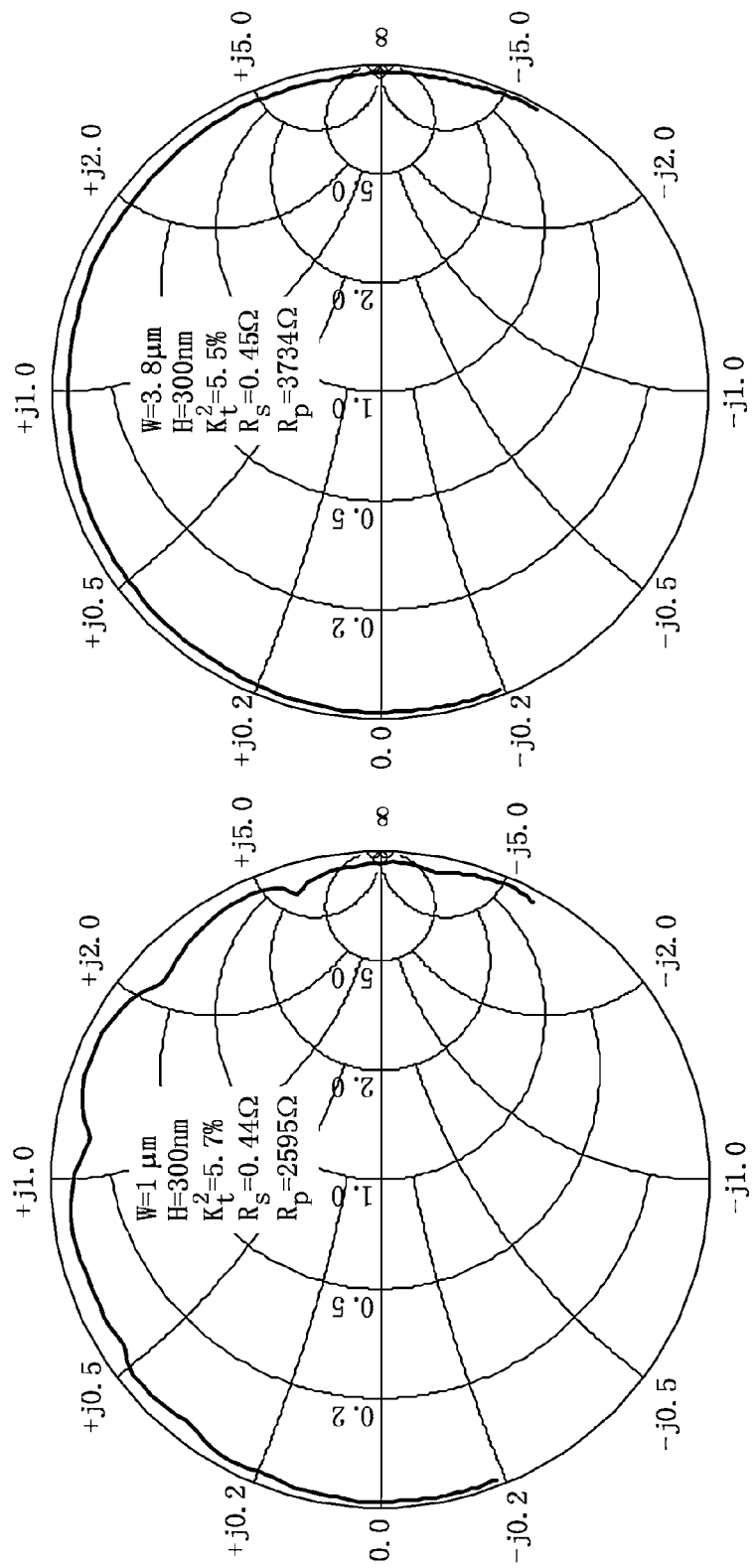
FIGS. 4A-4D show the Smith chart representation of the responses ($S_{11}$) of an acoustic wave resonator with different widths of the gasket according to one embodiment of the present invention.
Figures 4C, 4D:
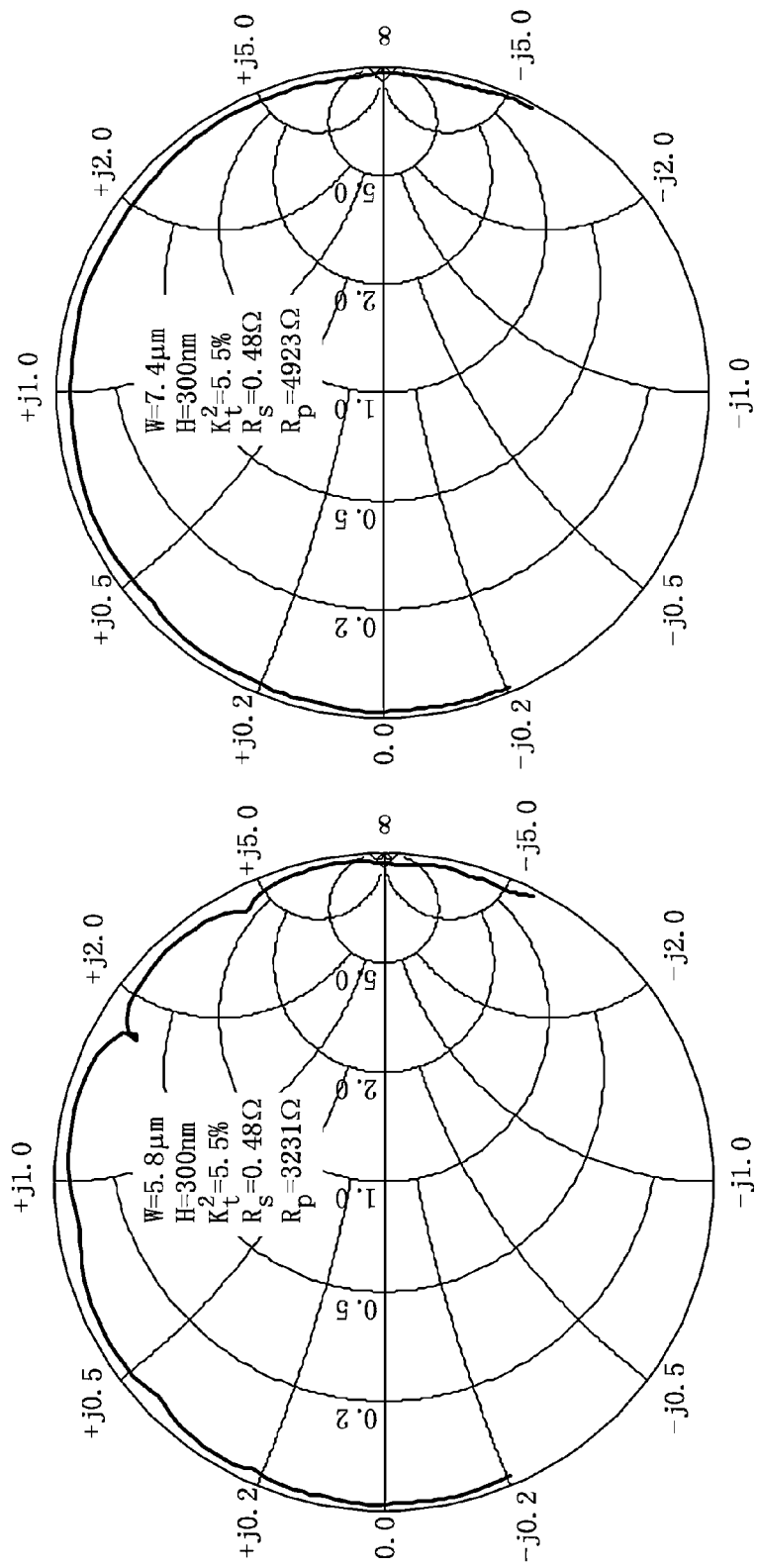

FIGS. 4A-4D show the Smith chart representation of the responses ($S_{11}$) of an acoustic wave resonator with a fixed height H and different widths W of the gasket according to the embodiment, for example, of FIG. 1A. The materials for the gasket and the top electrode of the acoustic wave resonator are silicon oxide and Mo, respectively. The dimensions, width W and height H, of the gasket and characteristics figures, $R_s$ (the quality factor $Q_s$ of a BAW resonator is inversely proportional to a parameter of resistance called $R_s$ near series resonant frequency), $R_p$ and $K_{t,eff}^2$, of the acoustic wave resonator are indicated on each chart. In these charts shown in FIGS. 4A-4D, the gasket height H is about 300 nm, while the gasket W is about 1 μm, 3.8 μm, 5.8 μm and 7.4 μm, respectively. Clearly, the acoustic wave resonator having a gasket with an optimal dimension, for example, the gasket height or thickness H being about 300 nm and the width W being about 3.8 μm, has superior characteristics with almost no spurious modes, as shown in FIG. 4B. When the gasket width W is narrower or wider than the optimal width, the acoustic wave resonator still exhibits a series of spurious resonances above $f_s$. The improvement in $Q_p$ values is obvious as well. The boundary gasket with the optimal width, e.g., about 3.8 μm and 7.4 μm, improves $R_p$ to about 3700-5000 Ohms. It is importantly worthy to note that $K_{t,eff}^2$ and $R_s$ (or $Q_s$) are almost unaltered when compared to that of a conventional BAW resonator in FIG. 8, mainly because there is no electrical field excited in the portions of the piezoelectric layer underneath the gasket.

Figures 5A, 5B:
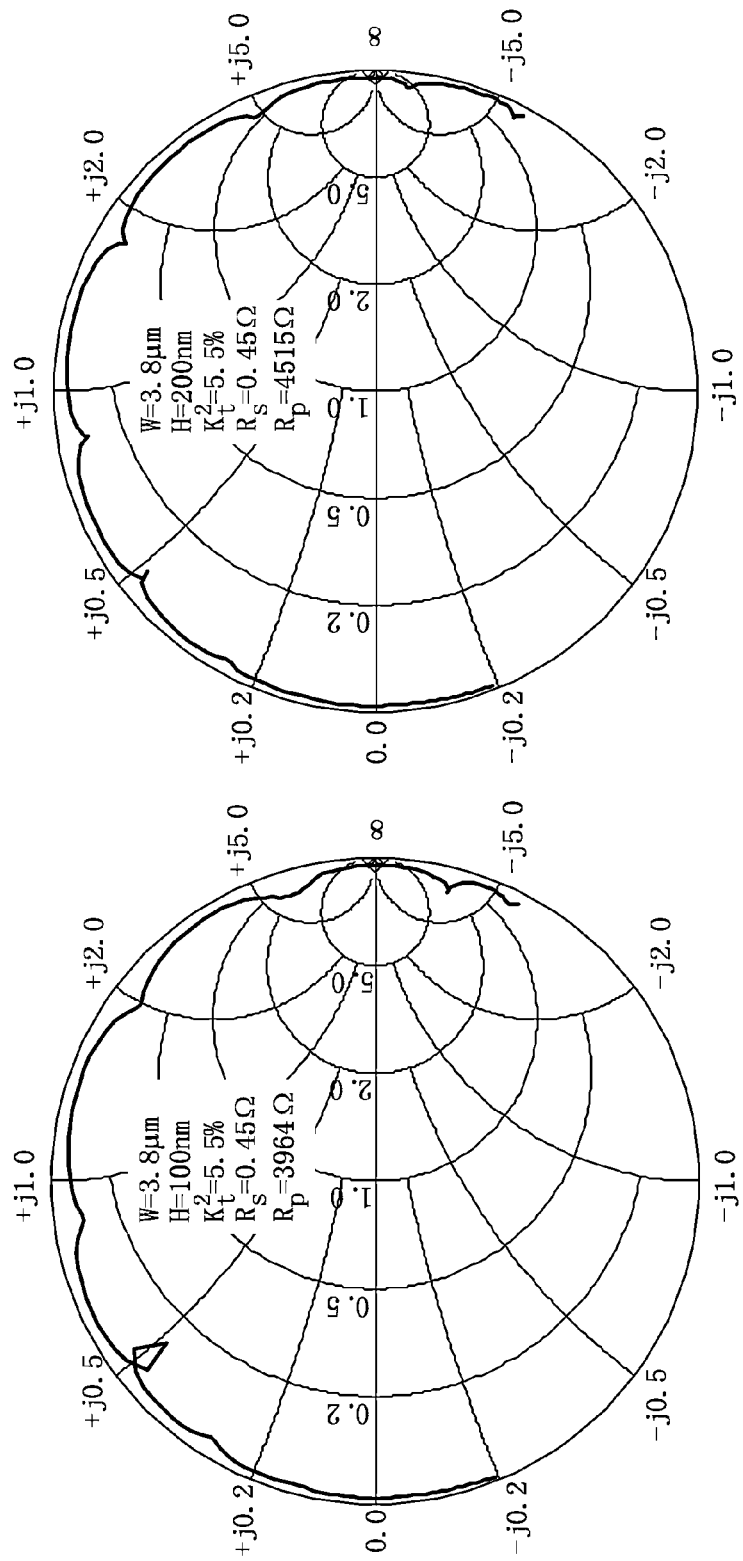
FIGS. 5A-5E show the Smith chart representation of the responses ($S_{11}$) of an acoustic wave resonator with different heights of the gasket according to one embodiment of the present invention.
Figures 5C, 5D:
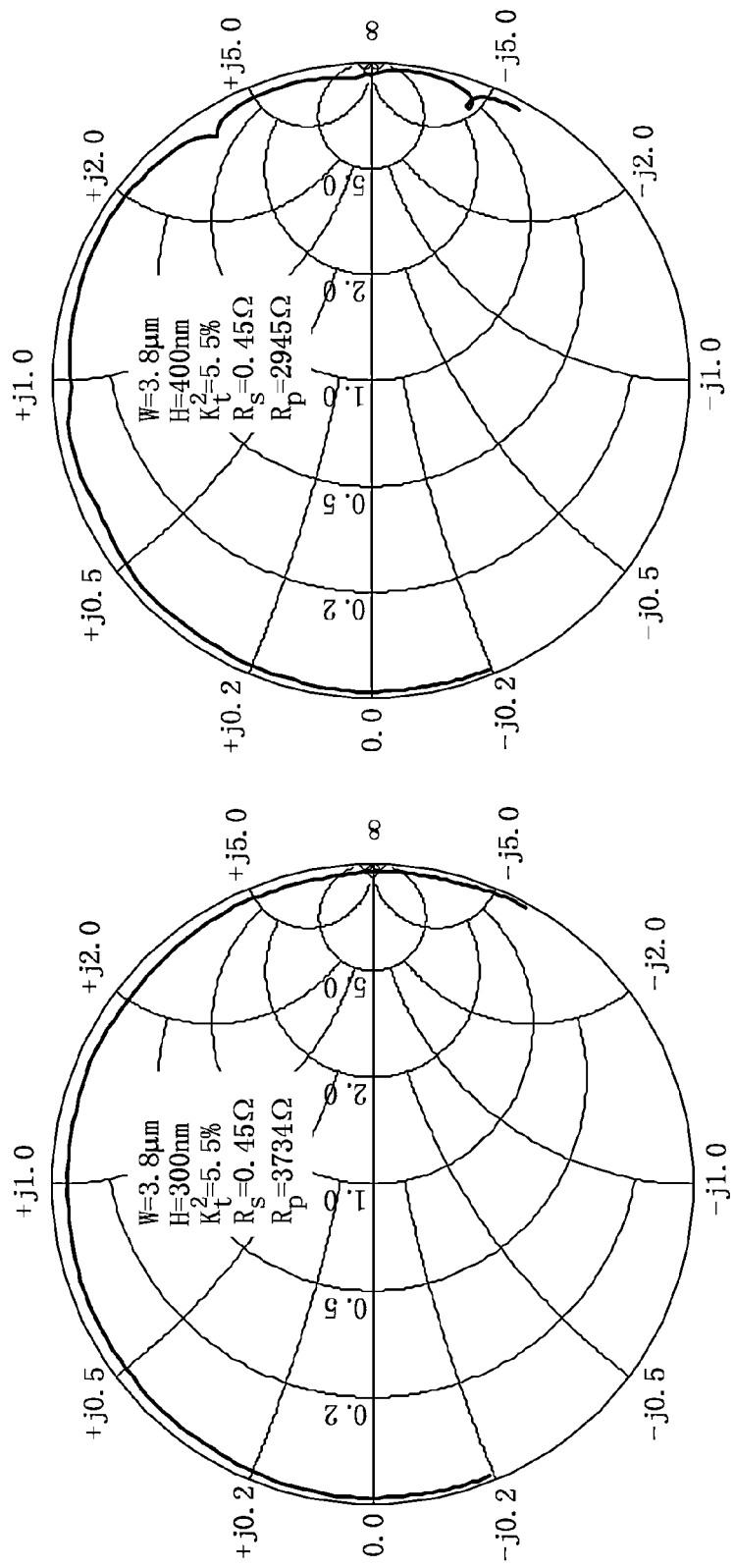
Figure 5E:
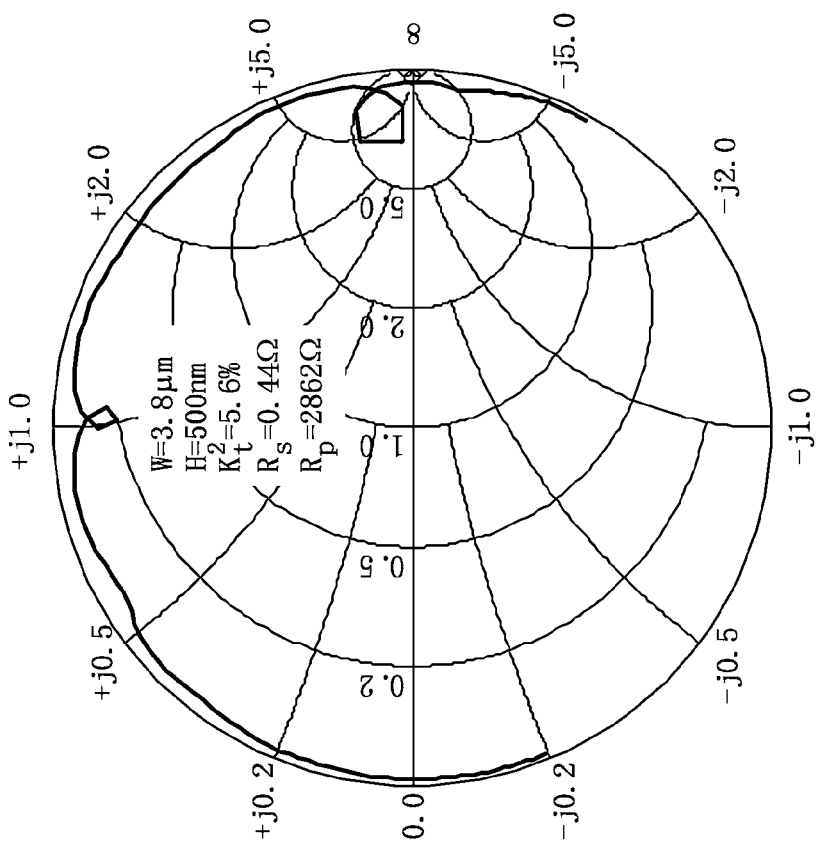

FIGS. 5A-5E show the Smith chart representation of the responses ($S_{11}$) of an acoustic wave resonator with a fixed width W and different heights H of the gasket according to the embodiment, for example, of FIG. 1A. The gasket and the top electrode of the acoustic wave resonator are formed of silicon oxide and Mo, respectively. The width W and the height H of the gasket and characteristics figures, $R_s$, $R_p$ and $K_{t,eff}^2$, of the acoustic wave resonator are indicated on each chart. In these charts shown in FIGS. 5A-5E, the gasket W is about 3.8 μm, while the gasket height H is about 100 nm, 200 nm, 300 nm, 400 nm and 500 nm, respectively. Similarly, the acoustic wave resonator having a gasket with an optimal dimension, for example, the gasket height or thickness H being about 300 nm and the width W being about 3.8 μm, has superior characteristics with almost no spurious modes, as shown in FIG. 5C. When the gasket height H is less or larger than the optimal height, the acoustic wave resonator still exhibits a series of spurious resonances above $f_s$.

Figures 6A, 6B:
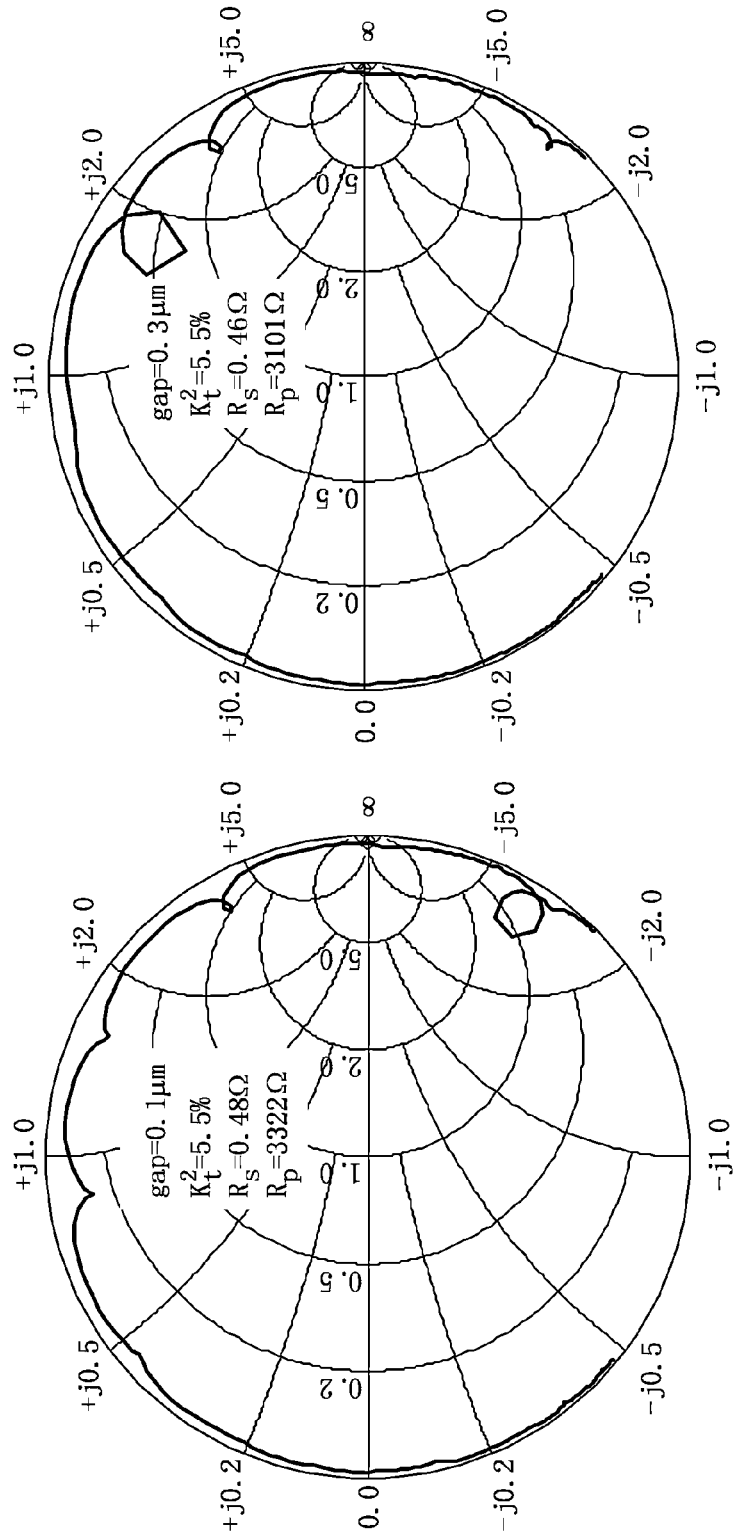
FIGS. 6A-6F show the Smith chart representation of the responses ($S_{11}$) of an acoustic wave resonator with different gaps of the gasket according to one embodiment of the present invention.
Figure 6D:
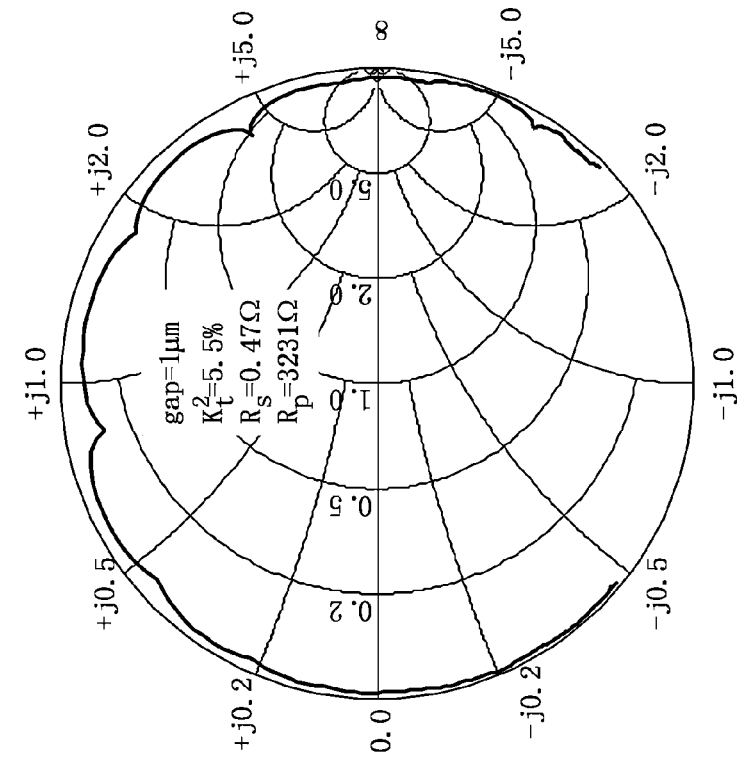
Figure 6C:
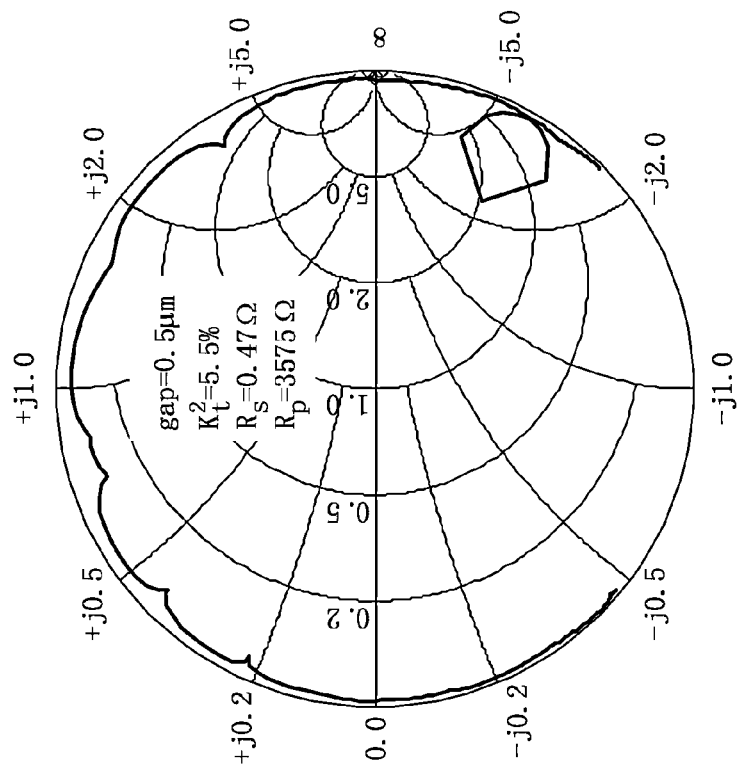
Figures 6E, 6F:
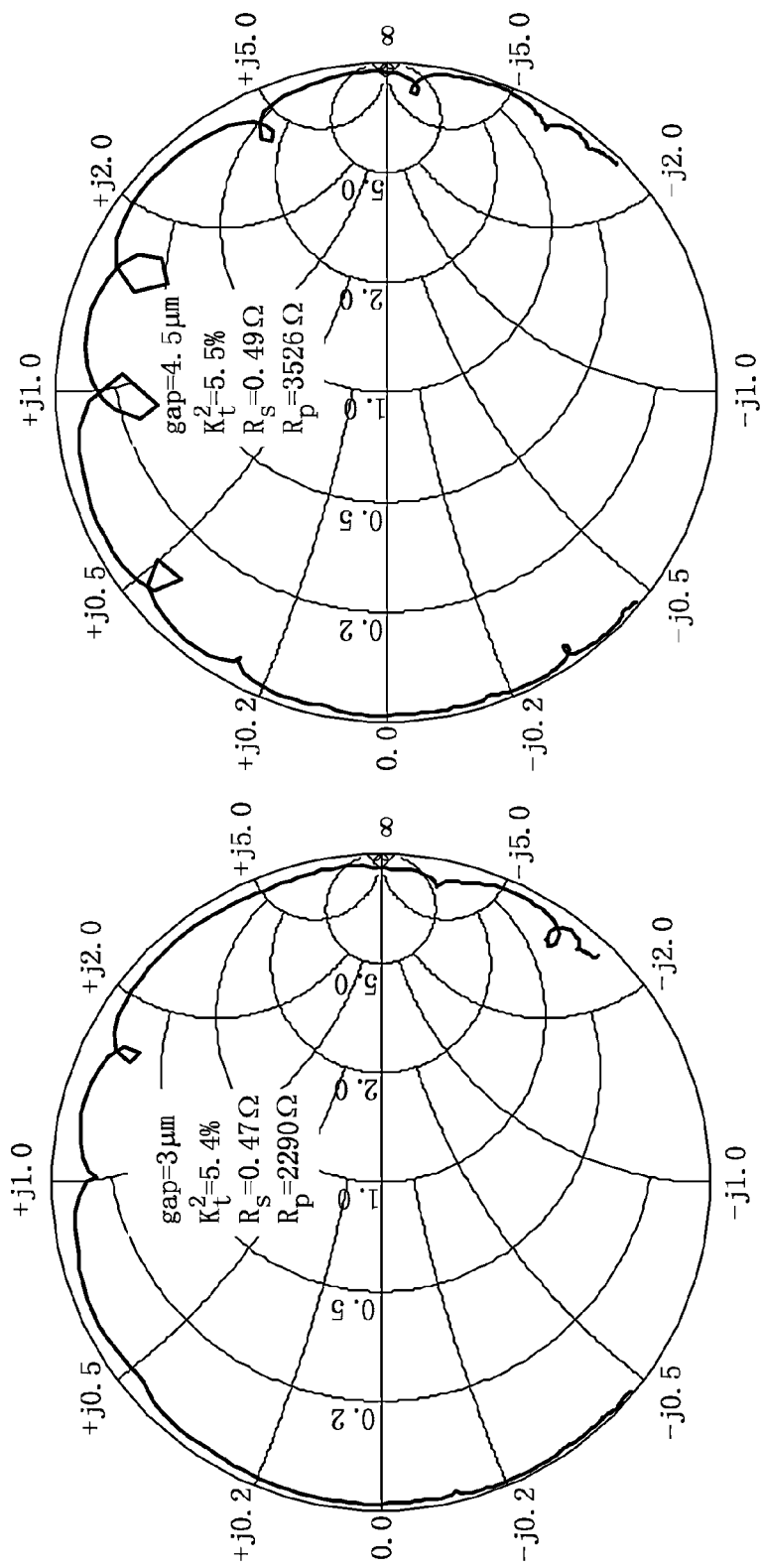
Figure 7:
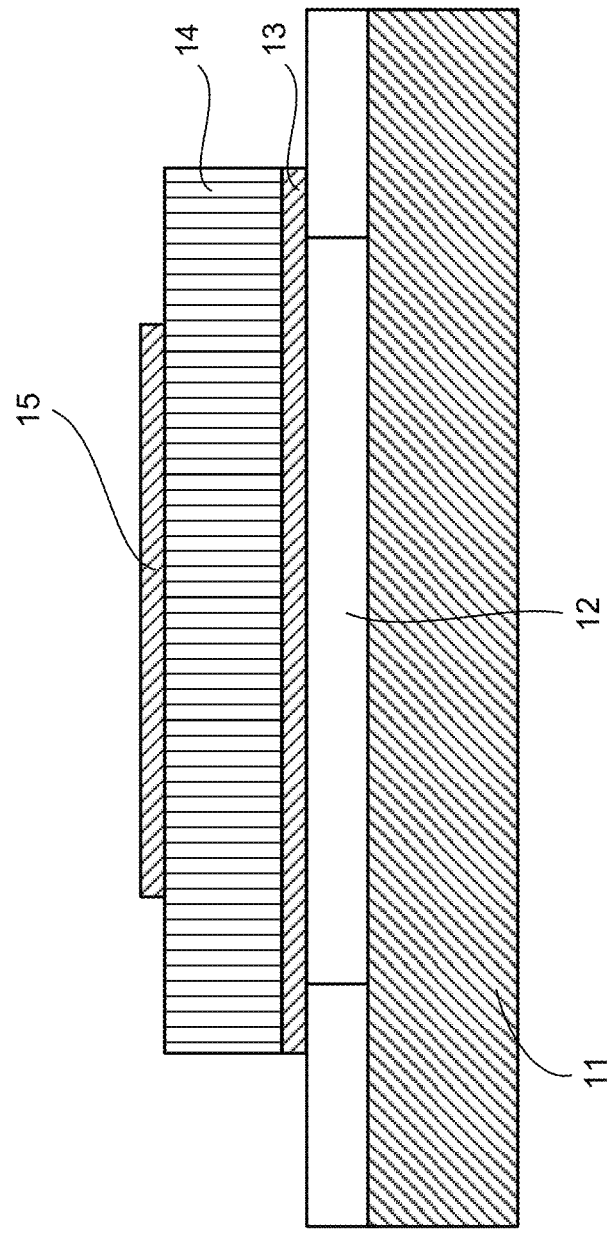
FIG. 7 shows schematically a cross sectional view of a conventional acoustic wave resonator.

In case the gasket is conductive, it is not electrically connected with the top electrode, e.g., there is certain distance or gap D3 between the edges of the gasket and the top electrode, as shown in FIG. 2A. FIGS. 6A-6F show the Smith chart representation of the responses ($S_{11}$) of an acoustic wave resonator with different gaps D3 of the gasket according to the embodiment, for example, of FIG. 2A. The material for the gasket is molybdenum. The width W and the height H of the gasket is 3.5 μm and 200 nm, respectively. The gap D3 is about 0.1 μm, 0.3 μm, 0.5 μm, 1 μm, 3 μm and 4.5 μm, respectively, in FIGS. 6A-6F. Similar to the case where a gasket is aligned with the edges of the top electrode, $R_p$ can be improved to be well above 3000 Ohms. However, the spurious modes may remain present with variation of the gap D3, in some cases, for example when the gap D3 is about 4.5 μm, spurious modes above $f_s$ are fairly strong and spurious resonance below $f_s$ appears, as shown in FIG. 6F.

In summary, the present invention, among other things, recites an acoustic wave resonator that utilizes a boundary means such as a gasket surrounding one of the top and bottom electrodes to enhance the electrical performance thereof.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An acoustic wave resonator, comprising:
   (a) a substrate;
   (b) an acoustic isolator formed in or on the substrate, having a perimeter defining a first edge and an opposite, second edge;
   (c) a first electrode formed on the acoustic isolator;
   (d) a piezoelectric layer formed on the first electrode;
   (e) a second electrode formed on the piezoelectric layer, having a perimeter defining a first edge and an opposite, second edge, wherein the perimeter of the second electrode is aligned inside the perimeter of the acoustic isolator; and
   (f) a gasket formed on the piezoelectric layer such that the gasket surrounds the perimeter of the second electrode and is aligned inside the perimeter of the acoustic isolator, wherein the gasket is formed of a metal material, and wherein a gap defined by a distance between the gasket and the perimeter of the second electrode is filled with a non-conductive material.

2. An acoustic wave resonator, comprising:
(a) a substrate;
(b) an acoustic isolator formed in or on the substrate, having a perimeter defining a first edge and an opposite, second edge;
(c) a first electrode formed on the acoustic isolator, having a perimeter defining a first edge and an opposite, second edge;
(d) a piezoelectric layer formed on the first electrode;
(e) a second electrode formed on the piezoelectric layer, having a perimeter defining a first edge and an opposite, second edge, wherein one of the perimeters of the first and second electrodes is aligned entirely inside the perimeter of the acoustic isolator, and the other of the perimeters of the first and second electrodes is aligned entirely outside the perimeter of the acoustic isolator; and
(f) a gasket formed such that the gasket surrounds the one of the first and second electrodes whose perimeter is aligned entirely inside the perimeter of the acoustic isolator, wherein the gasket is formed of a metal material, and wherein a gap defined by a distance between the gasket and the perimeter of the one of the first and second electrodes is filled with a non-conductive material.

3. An acoustic wave resonator, comprising:
(a) a substrate;
(b) an acoustic isolator formed in or on the substrate, having a perimeter defining a first edge and an opposite, second edge;
(c) a first electrode formed on the acoustic isolator;
(d) a piezoelectric layer formed on the first electrode;
(e) a second electrode formed on the piezoelectric layer, having a perimeter defining a first edge and an opposite, second edge, wherein the perimeter of the second electrode is aligned inside the perimeter of the acoustic isolator; and
(f) a gasket formed on the piezoelectric layer such that the gasket surrounds the perimeter of the second electrode and is aligned inside the perimeter of the acoustic isolator, wherein the gasket has a lateral side facing the second electrode, wherein the lateral side has a curve profile, a multi-step profile, or a combination of them, wherein the gasket and the perimeter of the second electrode define a third distance, D3, therebetween, wherein the gasket is formed of a metal material same as or substantially different from that of the first and second electrodes, and wherein $0<D3\leq 20$ μm, wherein a gap defined by the third distance D3 between the gasket and the perimeter of the second electrode is filled with a non-conductive material.

4. The acoustic wave resonator of claim 3, wherein the first edges of the acoustic isolator and the second electrode define a first distance, D1, therebetween, and the second edges of the acoustic isolator and the second electrode define a second distance, D2, therebetween.

5. The acoustic wave resonator of claim 3, wherein the gasket is configured to establish a boundary condition surrounding the perimeter of the second electrode so as to provide energy trapping of Lamb modes within the acoustic wave resonator.

6. The acoustic wave resonator of claim 4, wherein the gasket has a width, W, and a height, H, and wherein the width W is less than the first and second distances D1 and D2.

7. The acoustic wave resonator of claim 3, wherein the acoustic isolator comprises an air cavity or an acoustic mirror.

8. An acoustic wave resonator, comprising:
(a) a substrate;
(b) an acoustic isolator formed in or on the substrate, having a perimeter defining a first edge and an opposite, second edge;
(c) a first electrode formed on the acoustic isolator, having a perimeter defining a first edge and an opposite, second edge, wherein the perimeter of the first electrode is aligned entirely inside the perimeter of the acoustic isolator, wherein the first edges of the acoustic isolator and the first electrode define a first distance, D1, therebetween, and the second edges of the acoustic isolator and the first electrode define a second distance, D2, therebetween;
(d) a piezoelectric layer formed on the first electrode, wherein the piezoelectric layer comprises aluminum nitride or zinc oxide;
(e) a second electrode formed on the piezoelectric layer; and
(f) a gasket formed on the acoustic isolator such that the gasket is substantially in contact with the perimeter of the first electrode, is aligned entirely inside the perimeter of the acoustic isolator, and is located under the piezoelectric layer, wherein the gasket has a width, W, and a height, H, and wherein the width W is less than the first and second distances D1 and D2, wherein the gasket is formed of a dielectric material including silicon oxide, silicon carbide, silicon nitride, or aluminum nitride.

9. The acoustic wave resonator of claim 8, wherein the gasket is configured to establish a boundary condition surrounding the perimeter of the first electrode-so as to provide energy trapping of Lamb modes within the acoustic wave resonator.

10. The acoustic wave resonator of claim 8, wherein the gasket has a lateral side facing the first electrode, wherein the lateral side has a wall profile, a curve profile, a multi-step profile, a gradually variable profile, or a combination of them.

* * * * *